United States Patent
Hu et al.

(10) Patent No.: US 12,206,974 B2
(45) Date of Patent: Jan. 21, 2025

(54) OPTICAL ELEMENT DRIVING MECHANISM

(71) Applicant: TDK TAIWAN CORP., Taoyuan (TW)

(72) Inventors: Chao-Chang Hu, Taoyuan (TW); Shu-Shan Chen, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 223 days.

(21) Appl. No.: 17/895,437

(22) Filed: Aug. 25, 2022

(65) Prior Publication Data
US 2023/0067807 A1    Mar. 2, 2023

Related U.S. Application Data

(60) Provisional application No. 63/236,861, filed on Aug. 25, 2021.

(51) Int. Cl.
| | |
|---|---|
| *H04N 23/57* | (2023.01) |
| *G02B 7/04* | (2021.01) |
| *G03B 9/36* | (2021.01) |
| *H04N 23/51* | (2023.01) |
| *H04N 23/54* | (2023.01) |
| *H04N 23/55* | (2023.01) |
| *H10N 30/20* | (2023.01) |

(52) U.S. Cl.
CPC ............... *H04N 23/57* (2023.01); *G02B 7/04* (2013.01); *G03B 9/36* (2013.01); *H04N 23/51* (2023.01); *H04N 23/54* (2023.01); *H04N 23/55* (2023.01); *H10N 30/20* (2023.02)

(58) Field of Classification Search
CPC ........ H04N 23/57; H04N 23/51; H04N 23/54; H04N 23/55; H04N 23/58; G02B 7/04; G02B 27/646; G02B 7/08; G03B 9/36; G03B 17/17; G03B 5/06; G03B 30/00; G03B 2205/0061; G03B 2205/0069; H10N 30/20; H02K 41/0354; H02N 2/001; H02N 2/026
See application file for complete search history.

(56) References Cited

U.S. PATENT DOCUMENTS

| | | | | |
|---|---|---|---|---|
| 2011/0150441 A1* | 6/2011 | Ollila | ................. | H04N 23/54 396/55 |
| 2011/0262122 A1* | 10/2011 | Minamisawa | ......... | H04N 23/55 396/55 |
| 2012/0128339 A1* | 5/2012 | Hu | ..................... | G03B 5/06 359/555 |
| 2012/0268642 A1* | 10/2012 | Kawai | ................... | H04N 23/54 359/554 |
| 2013/0100304 A1* | 4/2013 | Wade | ................... | G02B 27/646 348/208.4 |

(Continued)

*Primary Examiner* — Abdelaaziz Tissire
(74) *Attorney, Agent, or Firm* — MUNCY, GEISSLER, OLDS & LOWE, P.C.

(57) ABSTRACT

An optical element driving mechanism is provided, including a fixed part, a movable part, and a driving assembly. The movable part includes a holder, and a supporting element. The holder holds an optical element. The supporting element is connected to the holder. The driving assembly drives the movable part to move relative to the fixed part. The holder uses the supporting element as a fulcrum and moves relative to the fixed part around the first axis and the second axis. The first axis is not parallel to the second axis.

19 Claims, 10 Drawing Sheets

(56) References Cited

U.S. PATENT DOCUMENTS

| | | | |
|---|---|---|---|
| 2018/0109660 A1* | 4/2018 | Yoon | H04N 23/687 |
| 2018/0231793 A1* | 8/2018 | Jeong | G03B 5/00 |
| 2018/0239162 A1* | 8/2018 | Lee | H04N 23/57 |
| 2018/0259787 A1* | 9/2018 | Kim | H04N 23/687 |
| 2018/0299651 A1* | 10/2018 | Yu | H02K 41/0354 |
| 2018/0321504 A1* | 11/2018 | Hu | G02B 7/09 |
| 2018/0364450 A1* | 12/2018 | Lee | H04N 23/55 |
| 2018/0367714 A1* | 12/2018 | Im | H04N 23/687 |
| 2020/0348479 A1* | 11/2020 | Kwon | G02B 7/102 |
| 2022/0030168 A1* | 1/2022 | Chang | H04N 23/55 |
| 2023/0161227 A1* | 5/2023 | Kim | G03B 13/36 |
| | | | 396/55 |

* cited by examiner

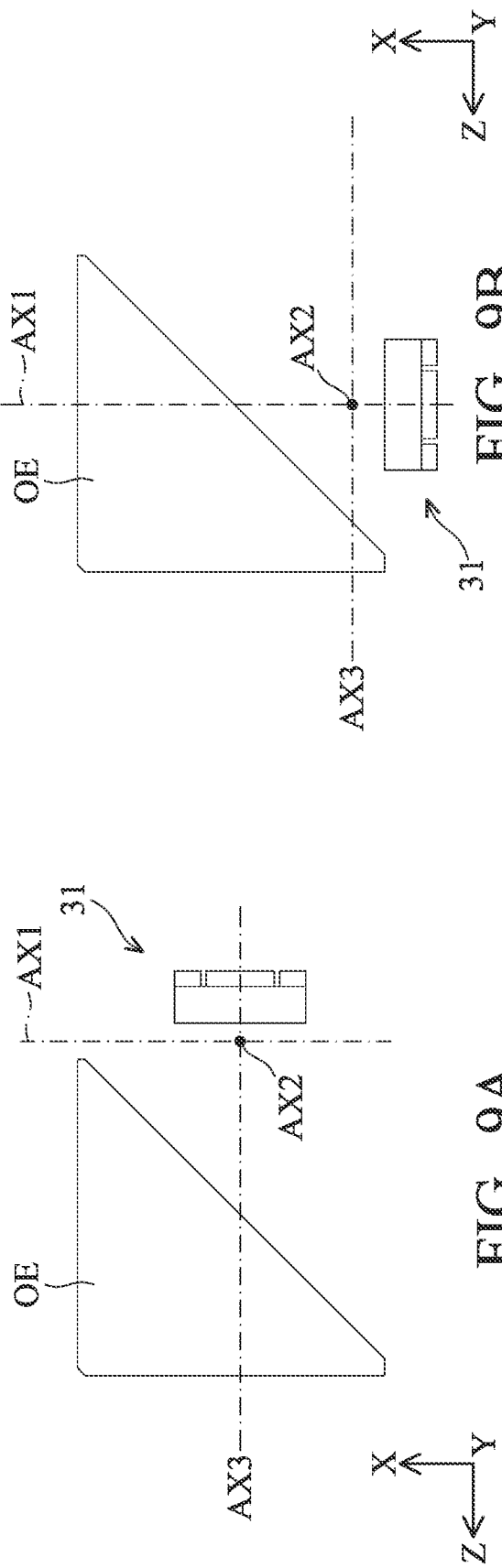
FIG. 9A
FIG. 9B
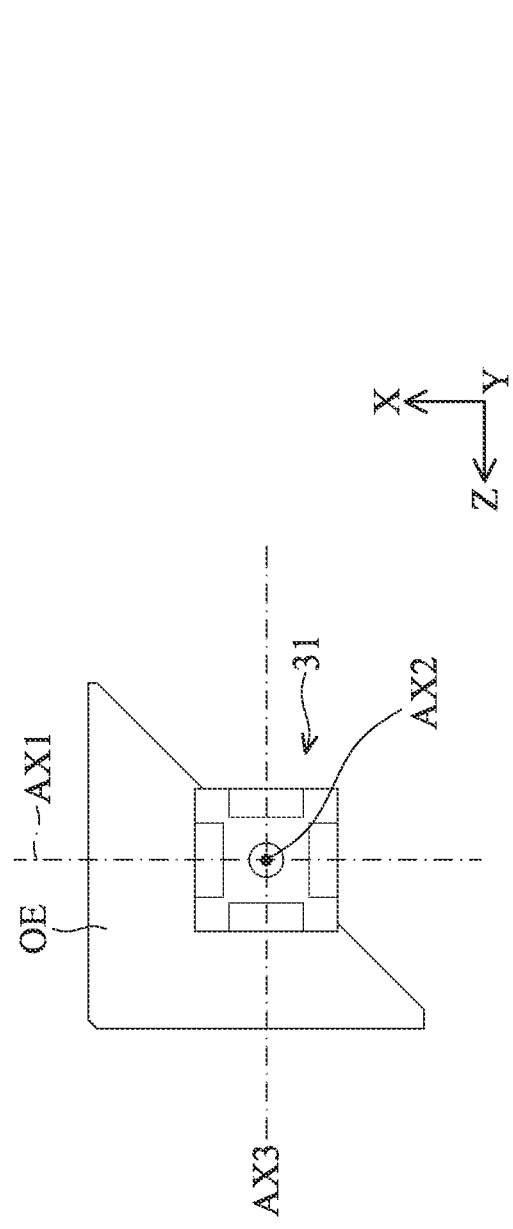
FIG. 9C

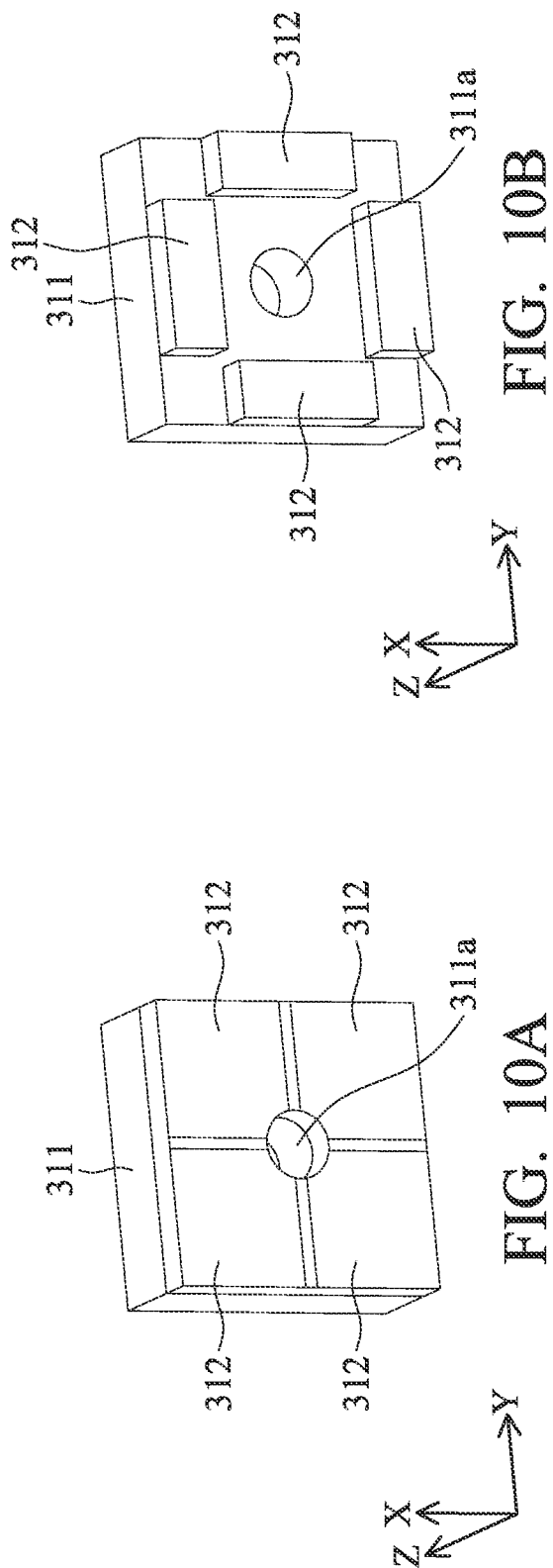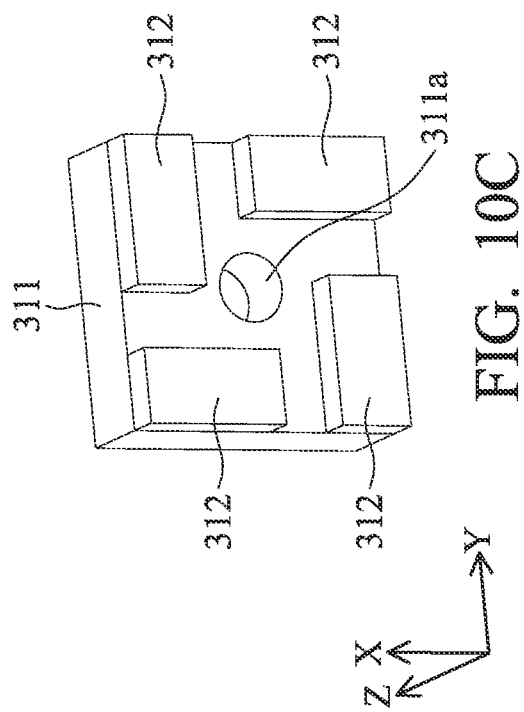

OPTICAL ELEMENT DRIVING MECHANISM

CROSS REFERENCE TO RELATED APPLICATIONS

This application claims the benefit of U.S. Provisional Application No. 63/236,861 filed Aug. 25, 2021, the entirety of which is incorporated by reference herein.

BACKGROUND OF THE INVENTION

Field of the Invention

The present disclosure relates to an optical element driving mechanism, and more particularly to the optical element driving mechanism of an electrical device.

Description of the Related Art

As the relevant technologies have been developed, many electronic devices (such as computers and tablets) have been equipped with the capability to record images and videos. However, when an optical element (such as a lens) having a long focal length is provided in an electronic device, the thickness of the electronic device may be increased, impeding the prospects for miniaturization of the electronic device. Therefore, how to design an optical element driving mechanism and an optical device that help to miniaturize the electronic device has become an important issue.

BRIEF SUMMARY OF THE INVENTION

An embodiment of the present invention provides an optical element driving mechanism, including a fixed part, a movable part, and a driving assembly. The movable part includes a holder, and a supporting element. The holder holds an optical element. The supporting element is connected to the holder. The driving assembly drives the movable part to move relative to the fixed part. The holder uses the supporting element as a fulcrum and moves relative to the fixed part around the first axis or the second axis. The first axis is not parallel to the second axis.

According to some embodiments of the present disclosure, the optical element driving mechanism further includes an elastic assembly. The elastic assembly includes an elastic-assembly movable-part connecting-portion, and an elastic-assembly fixed-part connecting-portion. The elastic-assembly movable-part connecting-portion is connected to the movable part. An elastic-assembly fixed-part connecting-portion is connected to the fixed part. The elastic-assembly movable-part connecting-portion and the elastic-assembly fixed-part connecting-portion do not overlap each other when viewed along the first axis.

According to some embodiments of the present disclosure, the movable part further includes a movable part magnet, and the fixed part further includes a fixed part magnetic conductive element. The movable part magnet is disposed on the holder, and the movable part magnet corresponds to the fixed part magnetic conductive element. The elastic assembly is disposed between the movable part magnet and the fixed part magnetic conductive element. The magnetic conductivity of the elastic assembly is lower than the magnetic conductivity of the fixed part magnetic conductive element.

According to some embodiments of the present disclosure, there are two movable part magnets, and the supporting element is disposed between the movable part magnets.

According to some embodiments of the present disclosure, the optical element driving mechanism further includes a sensing assembly, the sensing assembly includes a first sensing element, and a second sensing element. The first sensing element senses the movement of the movable part relative to the fixed part around the first axis. The second sensing element senses the movement of the movable part relative to the fixed part around the second axis. The movable part at least partially overlaps the second sensing element when viewed along the first axis. The movable part and the second sensing element do not overlap each other when viewed along the second axis. The movable part and the first sensing element do not overlap each other when viewed along the third axis. The third axis is not parallel to the first axis or the second axis.

According to some embodiments of the present disclosure, the driving assembly includes a piezoelectric assembly, and the piezoelectric assembly includes a piezoelectric-assembly metal-plate, and a plurality of piezoelectric elements. The piezoelectric-assembly metal-plate has a piezoelectric-assembly metal-plate through-hole. The piezoelectric elements are disposed on the piezoelectric-assembly metal-plate. The piezoelectric elements are rotationally symmetric with the piezoelectric-assembly metal-plate through-hole as the rotational symmetry center. The piezoelectric-assembly metal-plate through-hole has a chamfered structure, and the supporting element is in contact with the chamfered structure of the piezoelectric-assembly metal-plate through-hole.

According to some embodiments of the present disclosure, a plurality of voltages that are applied to the piezoelectric elements have different phases, so that the piezoelectric elements and the piezoelectric-assembly metal-plate produce peristaltic movement to move the supporting element.

According to some embodiments of the present disclosure, the optical element driving mechanism further includes a connecting assembly. The connecting assembly includes an insulating glue. The insulating glue is disposed between the piezoelectric elements, and the piezoelectric elements share a ground wire.

According to some embodiments of the present disclosure, the piezoelectric assembly at least partially overlaps the optical element when viewed along the first axis. The piezoelectric assembly and the optical element do not overlap each other when viewed along the second axis. The piezoelectric assembly and the optical element do not overlap each other when viewed along the third axis that is not parallel to the first axis or the second axis.

According to some embodiments of the present disclosure, the piezoelectric assembly at least partially overlaps the optical element when viewed along the second axis. The piezoelectric assembly and the optical element do not overlap each other when viewed along the first axis. The piezoelectric assembly and the optical element do not overlap each other when viewed along the third axis that is not parallel to the first axis or the second axis.

According to some embodiments of the present disclosure, the piezoelectric assembly at least partially overlaps the optical element when viewed along the third axis that is not parallel to the first axis or the second axis. The piezoelectric assembly and the optical element do not overlap each other when viewed along the first axis. The piezoelectric assembly and the optical element do not overlap each other when viewed along the second axis.

According to some embodiments of the present disclosure, the fixed part further includes a fixed part magnetic conductive element, and a fixed part elastic body. The fixed part elastic body is disposed on the fixed part magnetic conductive element, and the fixed part elastic body corresponds to the supporting element and the chamfered structure of the piezoelectric-assembly metal-plate through-hole. When viewed along the third axis that is not parallel to the first axis or the second axis, the fixed part elastic body at least partially overlaps the supporting element and the chamfered structure of the piezoelectric-assembly metal-plate through-hole. The fixed part elastic body and the centers of the piezoelectric elements do not overlap each other when viewed along the third axis. The fixed part elastic body has higher flexibility than the fixed part magnetic conductive element. The fixed part elastic body includes plastic or rubber.

According to some embodiments of the present disclosure, the fixed part further includes a base, and the base includes a base body, a first-base protruding-portion, a second-base protruding-portion, and a third-base protruding-portion. The first-base protruding-portion extends from the base body toward the piezoelectric assembly along the first axis, and the first-base protruding-portion is in contact with the piezoelectric assembly. The second-base protruding-portion extends from the base body toward the piezoelectric assembly along the second axis, and the second-base protruding-portion is in contact with the piezoelectric assembly. The third-base protruding-portion extends from the base body toward the piezoelectric assembly along the second axis, and the third-base protruding-portion is in contact with the piezoelectric assembly. The extending direction of the third-base protruding-portion is opposite to the extending direction of the second-base protruding-portion.

According to some embodiments of the present disclosure, the first-base protruding-portion, the second-base protruding-portion, and the third-base protruding-portion do not overlap each other when viewed along the first axis. The first-base protruding-portion and the second-base protruding-portion do not overlap each other when viewed along the second axis. The first-base protruding-portion and the third-base protruding-portion do not overlap each other when viewed along the second axis. The second-base protruding-portion at least partially overlaps the third-base protruding-portion when viewed along the second axis.

According to some embodiments of the present disclosure, the second-base protruding-portion includes a second-base protruding-portion first-protrusion, a second-base protruding-portion second-protrusion, and a second-base protruding-portion third-protrusion. The second-base protruding-portion first-protrusion is disposed between the second-base protruding-portion second-protrusion and the second-base protruding-portion third-protrusion. In the second axis, the length of the second-base protruding-portion first-protrusion is greater than the length of the second-base protruding-portion second-protrusion and the length of the second-base protruding-portion third-protrusion. The second-base protruding-portion first-protrusion at least partially overlaps the piezoelectric-assembly metal-plate through-hole when viewed along the second axis.

According to some embodiments of the present disclosure, the first-base protruding-portion includes a first-base protruding-portion first-protrusion, a first-base protruding-portion second-protrusion, and a first-base protruding-portion third-protrusion. The first-base protruding-portion first-protrusion is disposed between the first-base protruding-portion second-protrusion and the first-base protruding-portion third-protrusion. In the first axis, the length of the first-base protruding-portion first-protrusion is greater than the length of the first-base protruding-portion second-protrusion and the length of the first-base protruding-portion third-protrusion.

According to some embodiments of the present disclosure, the optical element driving mechanism further includes a connecting assembly. The connecting assembly includes a soft glue. The soft glue is disposed between the first-base protruding-portion first-protrusion and the piezoelectric assembly. The soft glue is not disposed between the first-base protruding-portion second-protrusion and the piezoelectric assembly. The soft glue is not disposed between the first-base protruding-portion third-protrusion and the piezoelectric assembly.

According to some embodiments of the present disclosure, the optical element driving mechanism further includes a circuit assembly. The fixed part includes a base, and the base includes a base body and a metal wire. The metal wire is embedded in the base body, and the piezoelectric assembly is electrically connected to the circuit assembly via the metal wire. The circuit assembly directly receives an external current.

According to some embodiments of the present disclosure, the optical element driving mechanism further includes a sensing element. The sensing element includes a first sensing element and a second sensing element. The circuit assembly includes a circuit element, and the circuit element includes a circuit element first portion, and a circuit element second portion. The circuit element first portion is perpendicular to the first axis, and the circuit element first portion extends along the second axis. The circuit element second portion is perpendicular to the second axis, and the circuit element first portion extends along the first axis. The first sensing element is disposed on the circuit element second portion, and the second sensing element is disposed on the circuit element first portion.

According to some embodiments of the present disclosure, the circuit element further includes a reinforcement assembly, and the reinforcement assembly includes a first reinforcement element, and a second reinforcement element. The first reinforcement element is disposed on the circuit element first portion. The second reinforcement element is disposed on the circuit element second portion. The circuit element first portion is disposed between the holder and the first reinforcement element. The circuit element second portion is disposed between the holder and the second reinforcement element.

BRIEF DESCRIPTION OF THE DRAWINGS

The present invention may be more fully understood by reading the subsequent detailed description and examples with references made to the accompanying drawings, wherein:

FIG. 9A is a schematic view of the configuration of a piezoelectric assembly of the optical element driving mechanism and the optical element according to some embodiments of the present disclosure.

FIG. 9B is a schematic view of the configuration of the piezoelectric assembly of the optical element driving mechanism and the optical element according to some embodiments of the present disclosure.

FIG. 9C is a schematic view of the configuration of the piezoelectric assembly of the optical element driving mechanism and the optical element according to some embodiments of the present disclosure.

FIG. 10A is a schematic view of the configuration of the piezoelectric assembly of the optical element driving mechanism according to some embodiments of the present disclosure.

FIG. 10B is a schematic view of the configuration of the piezoelectric assembly of the optical element driving mechanism according to some embodiments of the present disclosure.

FIG. 10C is a schematic view of the configuration of the piezoelectric assembly of the optical element driving mechanism according to some embodiments of the present disclosure.

DETAILED DESCRIPTION OF THE INVENTION

The making and using of optical element driving mechanisms of embodiments of the present disclosure are discussed in detail below. It should be appreciated, however, that the embodiments provide many applicable inventive concepts that may be embodied in a wide variety of specific contexts. The specific embodiments discussed are merely illustrative of specific ways to make and use the embodiments and do not limit the scope of the disclosure.

It should be understood that, although the terms "first", "second" etc. may be used herein to describe various elements, layers and/or portions, and these elements, layers, and/or portions should not be limited by these terms. These terms are only used to distinguish one element, layer, or portion. Thus, a first element, layer or portion discussed below could be termed a second element, layer or portion without departing from the teachings of some embodiments of the present disclosure. In addition, for the sake of brevity, terms such as "first" and "second" may not be used in the description to distinguish different elements. As long as it does not depart from the scope defined by the appended claims, the first element and/or the second element described in the appended claims can be interpreted as any element that meets the description in the specification.

Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

The scale of the drawings in the present disclosure may be drawn according to the actual size. The scale of the same figure in the present disclosure can be used as the actual manufacturing scale of the devices, equipment, elements, etc. of the present disclosure. It should be noted that each figure may be drawn at different orientations, which may result in different size ratios among different figures. However, the size ratio shown in an individual figure is not affect by the different size ratios between different figures. People with ordinary skill in the art can understand that the size ratio of the figures in the present disclosure can be used as a distinguishing feature from the prior art.

Figure 1:
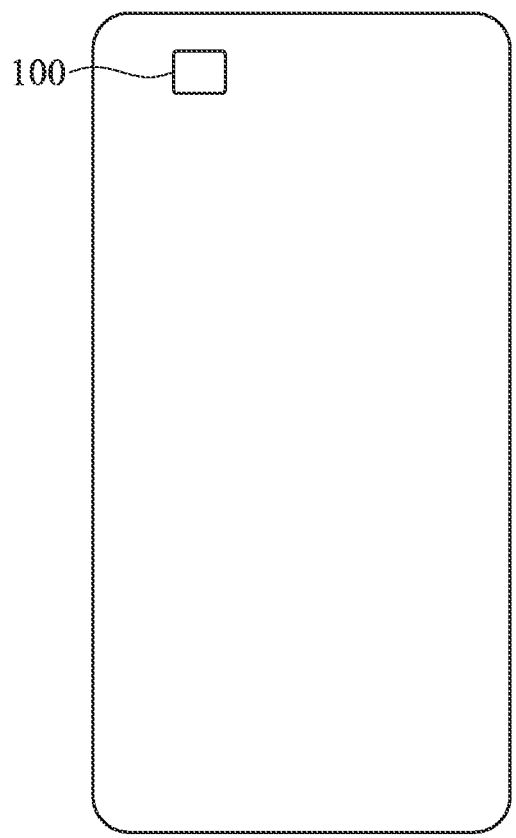
FIG. 1 is a schematic view of an electrical device according to some embodiment of the present disclosure.

Firstly, please refer to FIG. 1, FIG. 1 is a schematic view of an electrical device 1 according to some embodiment of the present disclosure. As shown in FIG. 1, an optical element driving mechanism 100 of some embodiment of the present disclosure may be mounted in an electrical device 1 for taking photos or videos, wherein the aforementioned electrical device 1 may, for example, be a smartphone or a digital camera, but the present disclosure is not limited to these. It should be noted that the position and the size between the optical element driving mechanism 100 and the electrical device 1 shown in FIG. 1 are only an example, which is not for limiting the position and the size between the optical element driving mechanism 100 and the electrical device 1. In fact, according to different needs, the optical element driving mechanism 100 may be mounted at different positions in the electrical device 1.

Figure 2:
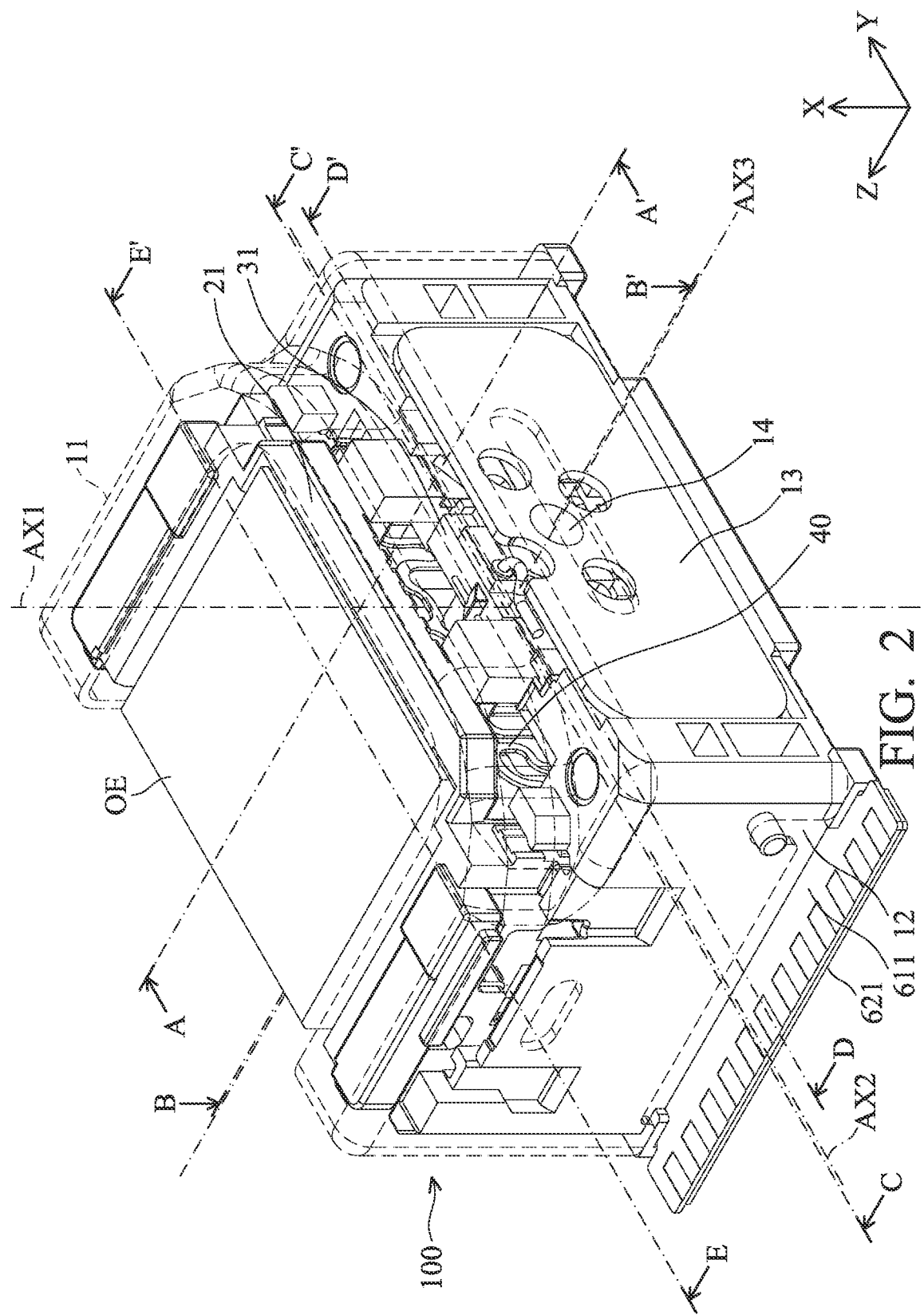
FIG. 2 is a schematic view of an optical element driving mechanism and an optical element according to some embodiments of the present disclosure, wherein an outer frame is shown as a dashed line.
Figure 3:
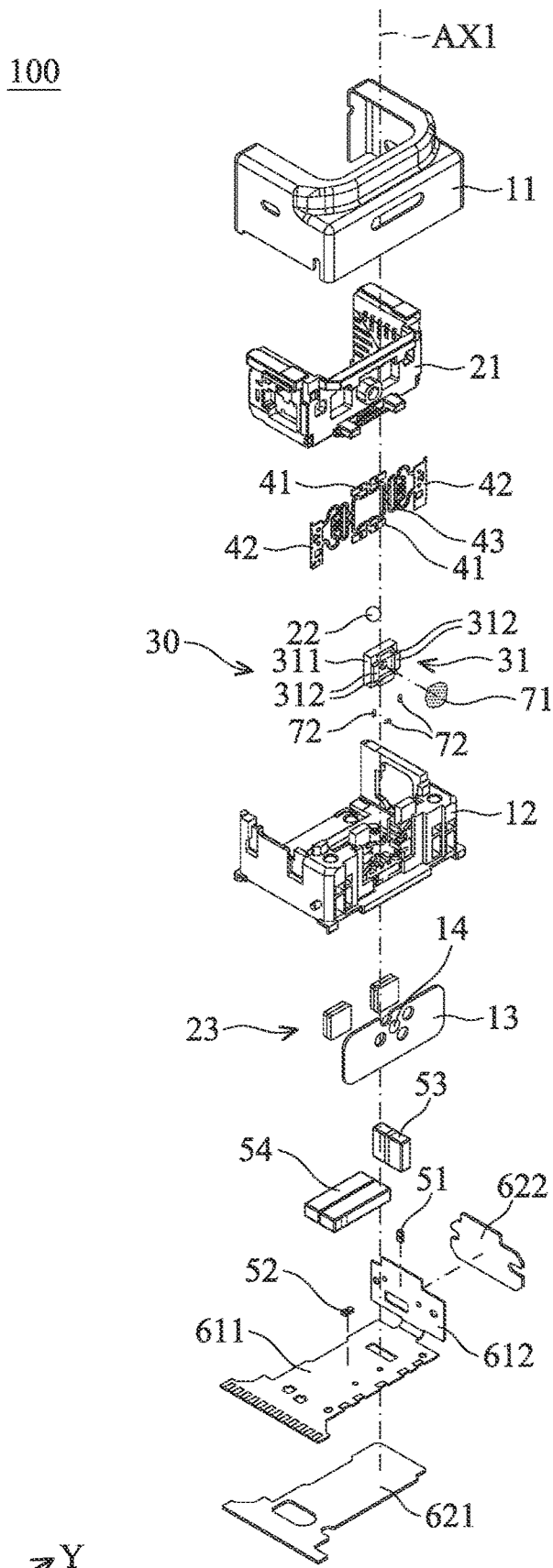
FIG. 3 is an exploded view of the optical element driving mechanism according to some embodiments of the present disclosure.
Figure 3:
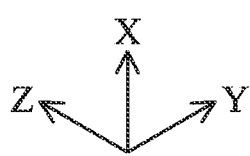

Please refer to FIG. 2. FIG. 2 is a schematic view of the optical element driving mechanism 100 and an optical element OE according to some embodiments of the present disclosure, wherein the outer frame is shown as a dashed line. FIG. 3 is an exploded view of the optical element driving mechanism 100 according to some embodiments of the present disclosure.

As shown in FIG. 2 and FIG. 3, the optical element driving mechanism 100 may include a fixed part 10, a movable part 20, a driving assembly 30, an elastic assembly 40, a sensing assembly 50, a circuit assembly 60, and a connecting assembly 70.

As shown in FIG. 2 and FIG. 3, the movable part 20 may be connected to the optical element OE, and the driving assembly 30 may drive the movable part 20 to move relative to the fixed part 10.

The fixed part 10 includes an outer frame 11, a base 12, a fixed part magnetic conductive element 13, and a fixed part elastic body 14.

According to some embodiments of the present disclosure, the outer frame 11 may be disposed on the base 12 to form an inner space, which may accommodate the elements of the optical element driving mechanism 100. According to some embodiments of the present disclosure, the fixed part magnetic conductive element 13 may be disposed on the base 12, and the fixed part elastic body 14 may be disposed on the fixed part magnetic conductive element 13.

The movable part 20 may include a holder 21, a supporting element 22, and a movable part magnet 23. The holder 21 may hold the optical element OE, so that the optical element OE moves with the holder 21. According to some embodiments of the present disclosure, the supporting element 22 may be connected to the holder 21, and the movable part magnet 23 may be disposed on the holder 21.

According to some embodiments of the present disclosure, the supporting element 22 may be fixedly connected to the holder 21 such that the supporting element 22 does not move relative to the holder 21.

According to some embodiments of the present disclosure, the holder 21 may take the supporting element 22 as a fulcrum and move relative to the fixed part 10 around the first axis AX1 and the second axis AX2.

According to some embodiments of the present disclosure, the first axis AX1 may not be parallel to the second axis AX2. According to some embodiments of the present disclosure, the first axis AX1 may be perpendicular to the second axis AX2. According to some embodiments of the present disclosure, for example, the first axis AX1 may be parallel to the X axis, and the second axis AX2 may be parallel to the Y axis.

The driving assembly 30 may include a piezoelectric assembly 31. The piezoelectric assembly 31 may include a piezoelectric-assembly metal-plate 311 and a plurality of piezoelectric elements 312. According to some embodiments of the present disclosure, the piezoelectric element 312 may be disposed on the piezoelectric-assembly metal-plate 311.

The elastic assembly 40 may include an elastic assembly movable part connecting-portion 41, an elastic assembly fixed part connecting-portion 42, and an elastic assembly string portion 43.

According to some embodiments of the present disclosure, the elastic assembly string portion 43 may be connected to the elastic assembly movable part connecting-portion 41 and the elastic assembly fixed part connecting-portion 42.

The sensing element 50 may include a first sensing element 51, a second sensing element 52, a first sensing magnetic element 53, and a second sensing magnetic element 54.

According to some embodiments of the present disclosure, the first sensing element 51 may correspond to the first sensing magnetic element 53, and the second sensing element 52 may correspond to the second sensing magnetic element 54.

The circuit assembly 60 may include a circuit element 61 and a reinforcement assembly 62. The circuit element 61 may include a circuit element first portion 611 and a circuit element second portion 612. The reinforcement assembly 62 may include a first reinforcement element 621 and a second reinforcement element 622. According to some embodiments of the present disclosure, the reinforcement assembly 62 may be disposed on the circuit element 61.

According to some embodiments of the present disclosure, the circuit element first portion 611 may be parallel to the second axis AX2 and the third axis AX3. According to some embodiments of the present disclosure, the circuit element first portion 611 may be perpendicular to the first axis AX1, and the circuit element first portion 611 may extend along the second axis AX2.

According to some embodiments of the present disclosure, the circuit element second portion 612 may be parallel to the first axis AX1 and the third axis AX3. According to some embodiments of the present disclosure, the circuit element second portion 612 may be perpendicular to the second axis AX2, and the circuit element second portion 612 may extend along the first axis AX1.

According to some embodiments of the present disclosure, the third axis AX3 may not be parallel to the first axis AX1 or the second axis AX2. According to some embodiments of the present disclosure, the third axis AX3 may be perpendicular to the first axis AX1 and the second axis AX2. According to some embodiments of the present disclosure, for example, the third axis AX3 may be parallel to the Z axis.

The connecting assembly 70 may include an insulating glue 71, and a soft glue 72.

Figure 4:
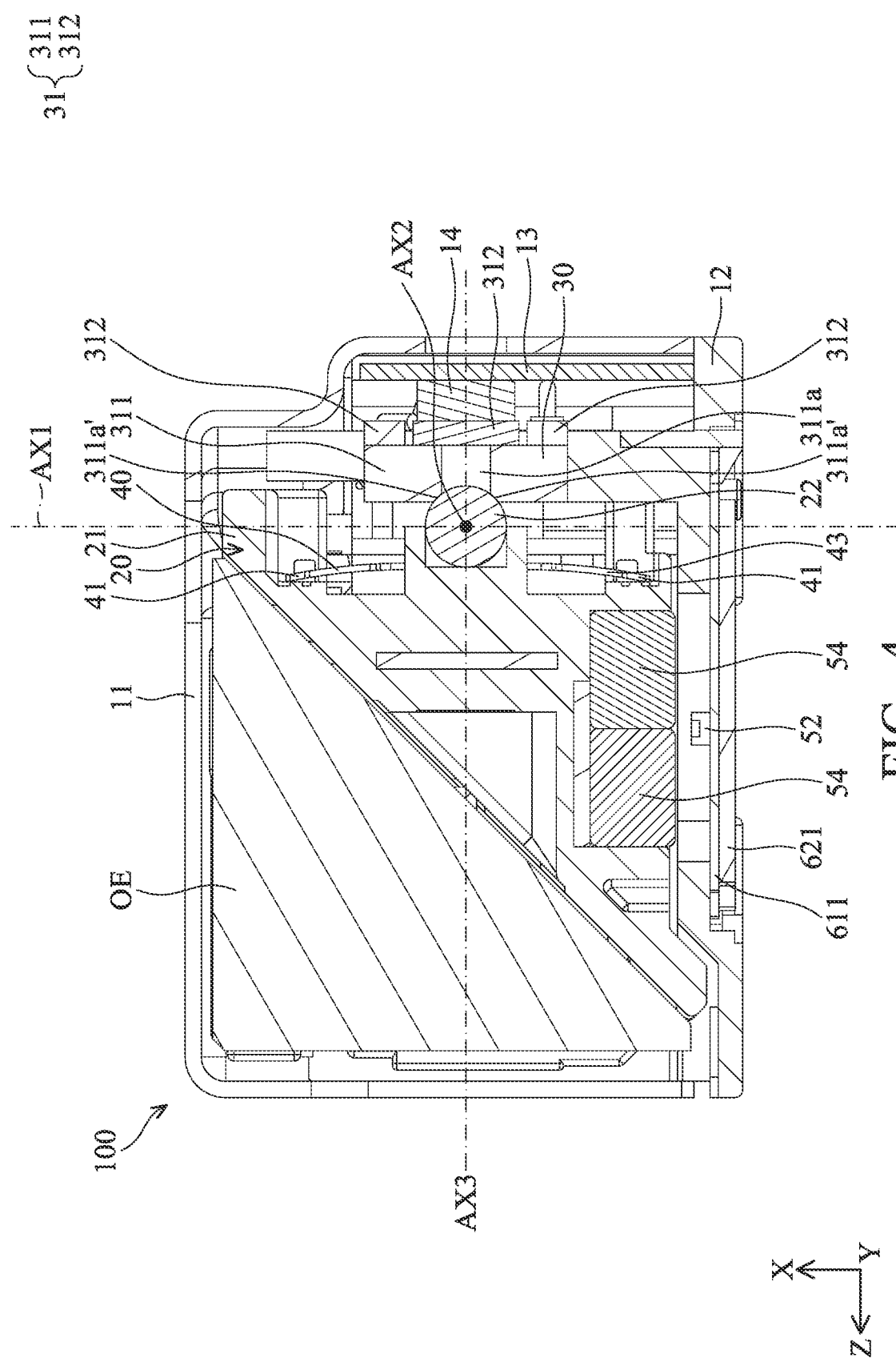
FIG. 4 is a cross-sectional view of the optical element driving mechanism and the optical element along line A-A' of FIG. 2, according to some embodiments of the present disclosure.

Please refer to FIG. 4, FIG. 4 is a cross-sectional view of the optical element driving mechanism 100 and the optical element OE along line A-A' of FIG. 2, according to some embodiments of the present disclosure.

As shown in FIG. 4, the supporting element 22 may be disposed between the holder 21 and the piezoelectric assembly 31. According to some embodiments of the present disclosure, the piezoelectric-assembly metal-plate 311 may be disposed between the supporting element 22 and the piezoelectric element 312.

Please continue to refer to FIG. 4, according to some embodiments of the present disclosure, the supporting element 22 may be in contact with the piezoelectric-assembly metal-plate 311 of the piezoelectric element 31. As shown in FIG. 4, the supporting element 22 may have a spherical shape, and the supporting element 22 may not be fixed to the piezoelectric-assembly metal-plate 311.

Please refer to FIG. 4, according to some embodiments of the present disclosure, the piezoelectric-assembly metal-plate 311 may have a piezoelectric-assembly metal-plate through-hole 311a. The piezoelectric-assembly metal-plate through-hole 311a may have a chamfered structure 311a', and the supporting element 22 may be in contact with the chamfered structure 311a' of the piezoelectric-assembly metal-plate through-hole 311a.

Therefore, when the metal plate 311 of the piezoelectric assembly produces a peristaltic movement, the supporting element 22 may move at the same time, so that the holder 21 and the optical element OE move relative to the fixed part 10. Also, the movement efficiency of the supporting element 22 may also be increased.

As shown in FIG. 4, according to some embodiments of the present disclosure, the second sensing element 52 may correspond to the second sensing magnetic element 54. That is, the second sensing element 52 may be disposed close to the second sensing magnetic element 54, and the second sensing element 52 may be disposed facing the second sensing magnetic element 54.

Please refer to FIG. 4, according to some embodiments of the present disclosure, the second sensing magnetic element 54 may be disposed between the holder 21 and the second sensing element 52. According to some embodiments of the present disclosure, the holder 21, the second sensing magnetic element 54 and the second sensing element 52 may be arranged along the first axis AX1.

According to some embodiments of the present disclosure, the holder 21, the second sensing magnetic element 54 and the second sensing element 52 may at least partially overlap when viewed along the first axis AX1. According to some embodiments of the present disclosure, the movable part 20 and the second sensing element 52 may not overlap when viewed along the second axis AX2.

As shown in FIG. 4, according to some embodiments of the present disclosure, the second sensing magnetic element 54 may be disposed on the holder 21, so that the second sensing element 52 may sense the movement of the holder 21 of the movable part 20 and the optical element OE around the second axis AX2 relative to the fixed part 10.

Please continue to refer to FIG. 4, according to some embodiments of the present disclosure, the elastic assembly 40 may be disposed between the outer frame 11 of the fixed part 10 and the holder 21 of the movable part 20. According to some embodiments of the present disclosure, the elastic assembly 40 may be disposed between the holder 21 and the piezoelectric assembly 31 of the driving assembly 30.

As shown in FIG. 4, according to some embodiments of the present disclosure, the elastic assembly movable part connecting-portion 41 of the elastic assembly 40 may be fixedly connected to the holder 21 of the movable part 20. According to some embodiments of the present disclosure, the elastic assembly fixed part connecting-portion 42 (may refer to FIG. 5) of the elastic assembly 40 may be fixedly connected to the base 12 of the fixed part 10.

According to some embodiments of the present disclosure, the elastic assembly movable part connecting-portion 41 and the elastic assembly and the elastic assembly fixed part connecting-portion 42 may not overlap each other when viewed along the first axis AX1. According to some embodiments of the present disclosure, the elastic assembly movable part connecting-portion 41 and the elastic assembly and the elastic assembly fixed part connecting-portion 42 may not overlap each other when viewed along the second axis AX2.

According to some embodiments of the present disclosure, the elastic assembly movable part connecting-portion 41 and the elastic assembly and the elastic assembly fixed part connecting-portion 42 may not overlap each other when viewed along the third axis AX3.

Please continue to refer to FIG. 4, the fixed part elastic body 14 may be disposed on the fixed part magnetic conductive element 13. According to some embodiments of the present disclosure, the fixed part elastic body 14 may correspond to the supporting element 22 and the chamfered structure 311a' of the piezoelectric-assembly metal-plate through-hole 311a. That is, the fixed part elastic body 14 and the supporting element 22 and the chamfered structure 311a' of the piezoelectric-assembly metal-plate through-hole 311a may at least partially overlap each other when viewed along the third axis AX3.

In this way, the supporting element 22 may be firmly abutted against the chamfered structure 311a' of the piezoelectric-assembly metal-plate through-hole 311a, so as to increase the stability of the optical element driving mechanism 100.

As shown in FIG. 4, according to some embodiments of the present disclosure, the fixed part elastic body 14 may be disposed between the piezoelectric assembly 31 and the fixed part magnetic conductive element 13. According to some embodiments of the present disclosure, the fixed part magnetic conductive element 13 may be disposed between the fixed part elastic body 14 and the outer frame 11.

According to some embodiments of the present disclosure, the elastic body 14 of the fixed part and the supporting element 22 may be disposed on both sides of the piezoelectric-assembly metal-plate through-hole 311a, respectively. According to some embodiments of the present disclosure, the piezoelectric element 312 may be disposed between the piezoelectric-assembly metal-plate 311 and the fixed part magnetic conductive element 13. According to some embodiments of the present disclosure, the chamfered structure 311a' and the piezoelectric element 312 may be disposed on both sides of the piezoelectric-assembly metal-plate 311.

According to some embodiments of the present disclosure, the piezoelectric element 312 may be disposed between the piezoelectric-assembly metal-plate 311 and the fixed part elastic body 14 (not shown in FIG. 4).

As shown in FIG. 4, according to some embodiments of the present disclosure, when viewed along the third axis AX3, the fixed part elastic body 14 may at least partially overlap the supporting element 22 and the chamfered structure 311a' of the piezoelectric-assembly metal-plate through-hole 311a.

According to some embodiments of the present disclosure, the fixed part elastic body 14 may have higher flexibility than the fixed part magnetic conductive element 13 (in other words, the fixed part elastic body 14 may be softer than the fixed part magnetic conductive element 13), and the fixed part elastic body 14 may include plastic or rubber.

In this way, the supporting element 22 may be firmly abutted against the chamfered structure 311a' of the piezoelectric-assembly metal-plate through-hole 311a, so as to increase the stability of the optical element driving mechanism 100.

Please refer to FIG. 4, according to some embodiments of the present disclosure, the piezoelectric assembly 31 and the holder 21 and the optical element OE may not overlap each other when viewed along the second axis AX2. According to some embodiments of the present disclosure, the piezoelectric assembly 31 and the optical element OE may not overlap each other when viewed along the first axis AX1.

According to some embodiments of the present disclosure, the piezoelectric assembly 31 may overlap the optical element OE when viewed along the third axis AX3. However, the present disclosure is not limited thereto, and the present disclosure may have different dispositions of the piezoelectric element 31, the holder 21 and the optical element OE.

Figure 5:
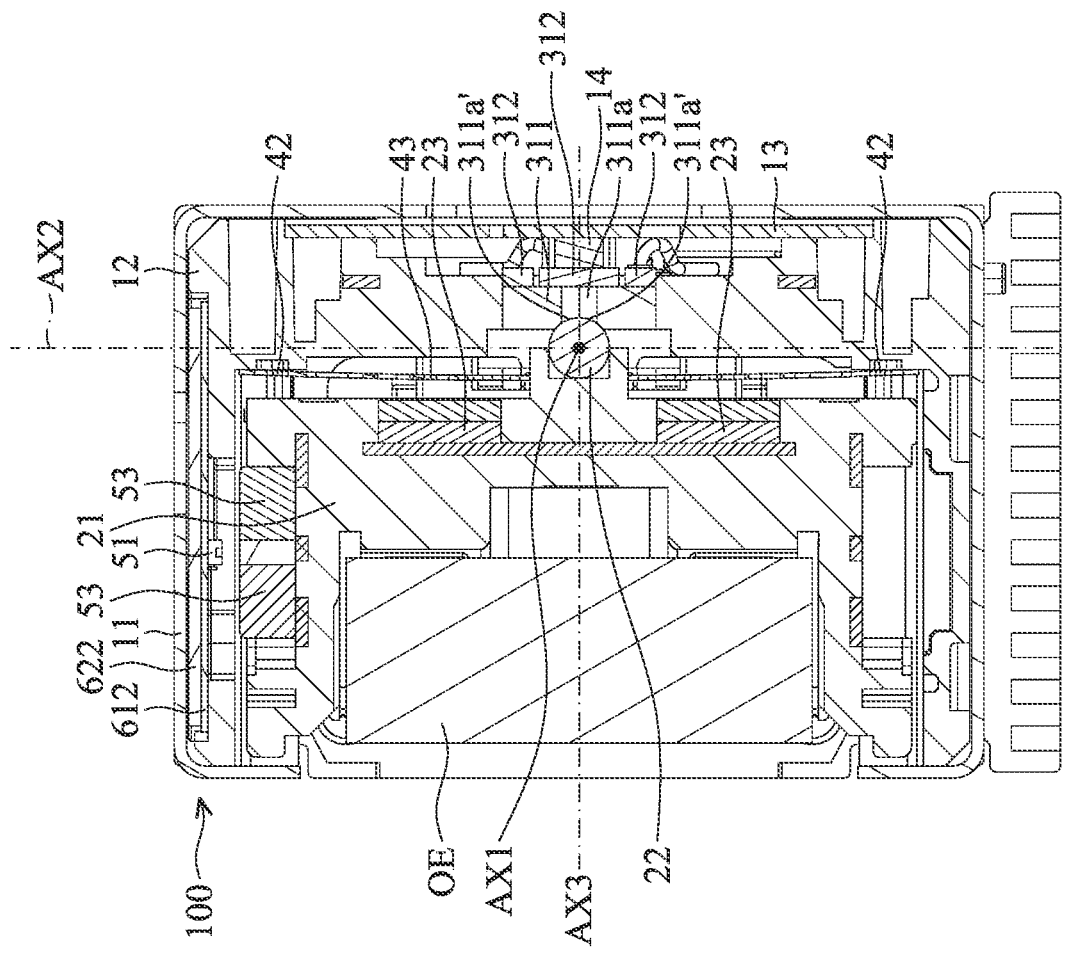
FIG. 5 is a cross-sectional view of the optical element driving mechanism and the optical element along line B-B' of FIG. 2, according to some embodiments of the present disclosure.

Please refer to FIG. 5, FIG. 5 is a cross-sectional view of the optical element driving mechanism 100 and the optical element OE along line B-B' of FIG. 2, according to some embodiments of the present disclosure.

As shown in FIG. 5, according to some embodiments of the present disclosure, the movable part magnet 23 may correspond to the fixed part magnetic conductive element 13. That is to say, the movable part magnet 23 may be disposed facing the fixed part magnetic conductive element 13.

According to some embodiments of the present disclosure, the movable part magnet 23 may be disposed on the holder 21 of the movable part 20. According to some embodiments of the present disclosure, the movable part magnet 23 may be disposed between the holder 21 and the fixed part magnetic conductive element 13.

In this way, by virtue of the magnetic attraction between the movable part magnet 23 and the fixed part magnetic conductive element 13, the supporting element 22 of the movable part 20 may abut against the chamfered structure 311a' of the piezoelectric-assembly metal-plate through-hole 311a of the piezoelectric assembly 31.

According to some embodiments of the present disclosure, the fixed part magnetic conductive element 13 may have a magnetic conductive material, such as metal or metal alloy.

According to some embodiments of the present disclosure, the elastic assembly 40 may be disposed between the movable part magnet 23 and the fixed part magnetic conductive element 13. As shown in FIG. 5, the elastic assembly string portion 43 of the elastic assembly 40 may be disposed between the movable part magnet 23 and the fixed part magnetic conductive element 13.

According to some embodiments of the present disclosure, the magnetic conductivity of the elastic assembly 40 is lower than the magnetic conductivity of the fixed part magnetic conductive element 13. In this way, the elastic assembly 40 will not be affected by the magnetic attraction force of the movable part magnet 23, thereby preventing the elastic assembly 40 from being deformed due to the magnetic attraction force of the movable part magnet 23.

According to some embodiments of the present disclosure, the movable part 20 may include two movable part magnets 23, and the supporting element 22 may be located between the two movable part magnets 23 when viewed along the third axis AX3.

Please continue to refer to FIG. 5, according to some embodiments of the present disclosure, the first sensing element 51 may correspond to the first sensing magnetic element 53. That is, the first sensing element 51 may be disposed close to the first sensing magnetic element 53, and the first sensing element 51 may be disposed facing the first sensing magnetic element 53.

Please refer to FIG. 5, according to some embodiments of the present disclosure, the first sensing magnetic element 53 may be disposed between the holder 21 and the first sensing element 51. According to some embodiments of the present disclosure, the holder 21, the first sensing magnetic element 53 and the first sensing element 51 may be disposed along the second axis AX2.

According to some embodiments of the present disclosure, the holder 21, the first sensing magnetic element 53 and the first sensing element 51 may at least partially overlap each other when viewed along the second axis AX2. According to some embodiments of the present disclosure, the movable part 20 may not overlap the first sensing element 51 when viewed along the third axis AX3.

As shown in FIG. 5, according to some embodiments of the present disclosure, the first sensing magnetic element 53 may be disposed on the holder 21, so that the first sensing element 51 may sense the movement of the holder 21 of the movable part 20 and the optical element OE around the first axis AX1 relative to the fixed part 10.

According to some embodiments of the present disclosure, the elastic assembly movable part connecting-portion 41 (FIG. 4) and the elastic assembly fixed part connecting-portion 42 (FIG. 5) of the elastic assembly 40 are not located on the same plane, so that the elastic assembly 40 has a pre-pressure. Therefore, the configuration of the elastic assembly 40 may allow the supporting element 22 of the movable part 20 to abut against the chamfered structure 311a' of the piezoelectric-assembly metal-plate through-hole 311a of the piezoelectric element 31.

Figure 6:
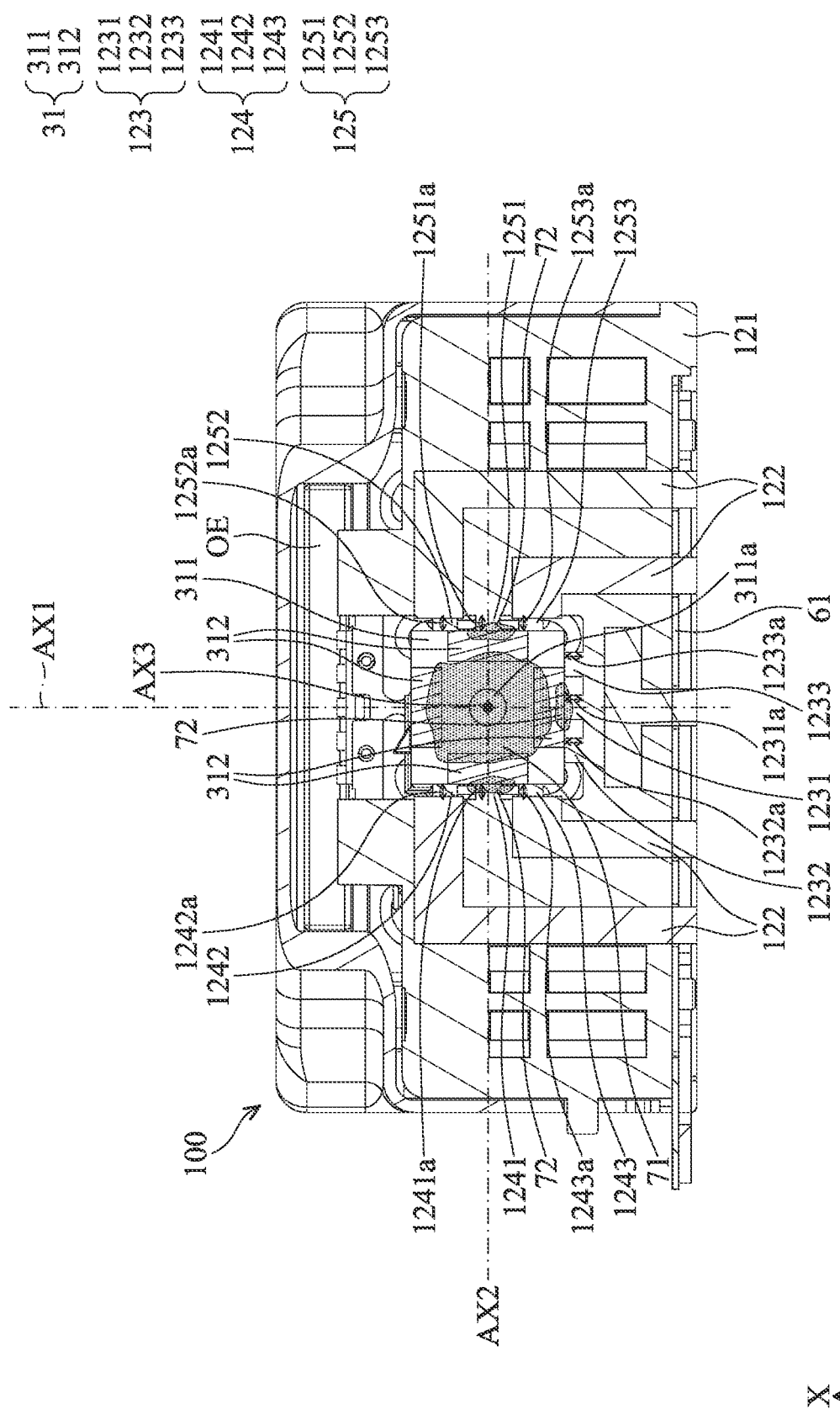
FIG. 6 is a cross-sectional view of the optical element driving mechanism and the optical element along line C-C' of FIG. 2, according to some embodiments of the present disclosure.

Please refer to FIG. 6, FIG. 6 is a cross-sectional view of the optical element driving mechanism 100 and the optical element OE along line C-C' of FIG. 2, according to some embodiments of the present disclosure.

As shown in FIG. 6, according to some embodiments of the present disclosure, the piezoelectric-assembly metal-plate 311 of the piezoelectric assembly 31 may be parallel to the first axis AX1 and the second axis AX2, and the piezoelectric-assembly metal-plate 311 may be perpendicular to the third axis AX3. According to some embodiments of the present disclosure, the piezoelectric assembly 31 may include four piezoelectric elements 312.

According to some embodiments of the present disclosure, the piezoelectric element 312 may be disposed on the piezoelectric-assembly metal-plate 311, and the piezoelectric element 312 may surround the piezoelectric-assembly metal-plate through-hole 311a of the piezoelectric-assembly metal-plate 311. According to some embodiments of the present disclosure, the piezoelectric element 312 and the piezoelectric-assembly metal-plate through-hole 311a may not overlap each other when viewed along the third axis AX3.

Please refer to FIG. 6, according to some embodiments of the present disclosure, the piezoelectric element 312 may be axisymmetric with the first axis AX1 as the axis of symmetry. According to some embodiments of the present disclosure, the piezoelectric element 312 may be axisymmetric with the second axis AX2 as the axis of symmetry. However, it should be noted that the disposition of piezoelectric elements 312 does not necessarily be axisymmetric.

According to some embodiments of the present disclosure, the piezoelectric element 312 may be rotationally symmetric with the piezoelectric-assembly metal-plate through-hole 311a of the piezoelectric-assembly metal-plate 311 as the rotational symmetry center. However, it should be noted that the disposition of piezoelectric elements 312 does not necessarily be rotational symmetric.

As shown in FIG. 6, the base 12 may include a base body 121, a metal wire 122, a first-base protruding-portion 123, a second-base protruding-portion 124, and a third-base protruding-portion 125.

According to some embodiments of the present disclosure, the metal wire 122 may be embedded in the base body 121, and the piezoelectric assembly 31 may be electrically connected to the circuit element 61 of the circuit assembly 60 via the metal wire 122.

Please refer to FIG. 6, according to some embodiments of the present disclosure, the first-base protruding-portion 123 may extend from the base body 121 toward the piezoelectric assembly 31 along the first axis AX1, and the first-base protruding-portion 123 may be in contact with the piezoelectric assembly 31.

According to some embodiments of the present disclosure, the second-base protruding-portion 124 may extend from the base body 121 toward the piezoelectric assembly 31 along the second axis AX2, and the second-base protruding-portion 124 may be in contact with the piezoelectric assembly 31.

According to some embodiments of the present disclosure, the third-base protruding-portion 125 may extend from the base body 121 toward the piezoelectric assembly 31 along the second axis AX2, and the third-base protruding-portion 125 may be in contact with the piezoelectric assembly 31.

Therefore, the first-base protruding-portion 123, the second-base protruding-portion 124, and the third-base protruding-portion 125 may abut against and support the piezoelectric assembly 31.

According to some embodiments of the present disclosure, the extending direction of the third-base protruding-portion 125 may be opposite to the extending direction of the second-base protruding-portion 124.

As shown in FIG. 6, according to some embodiments of the present disclosure, the first-base protruding-portion 123, the second-base protruding-portion 124, and the third-base protruding-portion 125 may not overlap each other when viewed along the first axis AX1. According to some embodiments of the present disclosure, the first-base protruding-portion 123, the second-base protruding-portion 124, and the third-base protruding-portion 125 may not overlap each other when viewed along the third axis AX3.

According to some embodiments of the present disclosure, the first-base protruding-portion 123 and the second-base protruding-portion 124 may not overlap each other when viewed along the second axis AX2. According to some embodiments of the present disclosure, the first-base protruding-portion 123 and the third-base protruding-portion 125 may not overlap each other when viewed along the second axis AX2. According to some embodiments of the present disclosure, the second-base protruding-portion 124 and the third-base protruding-portion 125 may at least partially overlap when viewed along the second axis AX2.

Please continue to refer to FIG. 6, the first-base protruding-portion 123 may include a first-base protruding-portion first-protrusion 1231, a first-base protruding-portion second-protrusion 1232, and a first-base protruding-portion third-protrusion 1233.

According to some embodiments of the present disclosure, the first-base protruding-portion first-protrusion 1231 may be disposed between the first-base protruding-portion second-protrusion 1232 and the first-base protruding-portion third-protrusion 1233.

According to some embodiments of the present disclosure, in the first axis AX1, the length 1231a of the first-base protruding-portion first-protrusion 1231 may be greater than the length 1232a of the first-base protruding-portion second-protrusion 1232 and the length 1233a of the first-base protruding-portion third-protrusion 1233.

According to some embodiments of the present disclosure, the first-base protruding-portion first-protrusion 1231 may at least partially overlap the piezoelectric-assembly metal-plate through-hole 311a of the piezoelectric-assembly metal-plate 311 when viewed along the first axis AX1.

As shown in FIG. 6, according to some embodiments of the present disclosure, the soft glue 72 may be disposed between the first-base protruding-portion first-protrusion 1231 and the piezoelectric assembly 31.

According to some embodiments of the present disclosure, the soft glue 72 may not be disposed between the first-base protruding-portion second-protrusion 1232 and the piezoelectric assembly 31.

According to some embodiments of the present disclosure, the soft glue 72 may not be disposed between the first-base protruding-portion third-protrusion 1233 and the piezoelectric assembly 31.

Therefore, the first-base protruding-portion first-protrusion 1231 may be used as a main element that supports the piezoelectric assembly 31, and the first-base protruding-portion second-protrusion 1232 and the first-base protruding-portion third-protrusion 1233 may be used as secondary elements that support the piezoelectric assembly 31.

In this way, the piezoelectric assembly 31 may be stably fixed, so as to increase the stability of the optical element driving mechanism 100 and achieve the effect of miniaturization.

Please continue to refer to FIG. 6, the second-base protruding-portion 124 may include a second-base protruding-portion first-protrusion 1241, a second-base protruding-portion second-protrusion 1242, and a second-base protruding-portion third-protrusion 1243.

According to some embodiments of the present disclosure, the second-base protruding-portion first-protrusion 1241 may be disposed between the second-base protruding-portion second-protrusion 1242 and the second-base protruding-portion third-protrusion 1243.

According to some embodiments of the present disclosure, in the second axis AX2, the length 1241a of the second-base protruding-portion first-protrusion 1241 is greater than the length 1242a of the second-base protruding-portion second-protrusion 1242 and the length 1243a of the second-base protruding-portion third-protrusion 1243.

According to some embodiments of the present disclosure, the second-base protruding-portion first-protrusion 1241 may at least partially overlap the piezoelectric-assembly metal-plate through-hole 311a of the piezoelectric-assembly metal-plate 311 when viewed along the second axis AX2.

As shown in FIG. 6, according to some embodiments of the present disclosure, the soft glue 72 may be disposed between the second-base protruding-portion first-protrusion 1241 and the piezoelectric assembly 31.

According to some embodiments of the present disclosure, the soft glue 72 may not be disposed between the second-base protruding-portion second-protrusion 1242 and the piezoelectric assembly 31.

According to some embodiments of the present disclosure, the soft glue 72 may not be disposed between the second-base protruding-portion third-protrusion 1243 and the piezoelectric assembly 31.

Therefore, the second-base protruding-portion first-protrusion 1241 may be used as a main element that supports the piezoelectric assembly 31, and the second-base protruding-portion second-protrusion 1242 and the second-base protruding-portion third-protrusion 1243 may be used as secondary elements that support the piezoelectric assembly 31.

In this way, the piezoelectric assembly 31 may be stably fixed, so as to increase the stability of the optical element driving mechanism 100 and achieve the effect of miniaturization.

Please continue to refer to FIG. 6, the third-base protruding-portion 125 may include a third-base protruding-portion first protrusion 1251, a third-base protruding-portion second protrusion 1252, and a third-base protruding-portion third protrusion 1253.

According to some embodiments of the present disclosure, the third-base protruding-portion first protrusion 1251 may be disposed between the third-base protruding-portion second protrusion 1252 and the third-base protruding-portion third protrusion 1253.

According to some embodiments of the present disclosure, in the second axis AX2, the length 1251a of the third-base protruding-portion first protrusion 1251 is greater than the length 1252a of the third-base protruding-portion second protrusion 1252 and the length 1253a of the third-base protruding-portion third protrusion 1253.

According to some embodiments of the present disclosure, the third-base protruding-portion first protrusion 1251 may at least partially overlap the piezoelectric-assembly metal-plate through-hole 311a of the piezoelectric-assembly metal-plate 311 when viewed along the second axis AX2.

As shown in FIG. 6, according to some embodiments of the present disclosure, the soft glue 72 may be disposed between the third-base protruding-portion first protrusion 1251 and the piezoelectric assembly 31.

According to some embodiments of the present disclosure, the soft glue 72 may not be disposed between the third-base protruding-portion second protrusion 1252 and the piezoelectric assembly 31.

According to some embodiments of the present disclosure, the soft glue 72 may not be disposed between the third-base protruding-portion third protrusion 1253 and the piezoelectric assembly 31.

Therefore, the third-base protruding-portion first protrusion 1251 may be used as a main element that supports the piezoelectric assembly 31, and the third-base protruding-portion second protrusion 1252 and the third-base protruding-portion third protrusion 1253 may be used as secondary elements that support the piezoelectric assembly 31.

In this way, the piezoelectric assembly 31 may be stably fixed, so as to increase the stability of the optical element driving mechanism 100 and achieve the effect of miniaturization.

Figure 7:
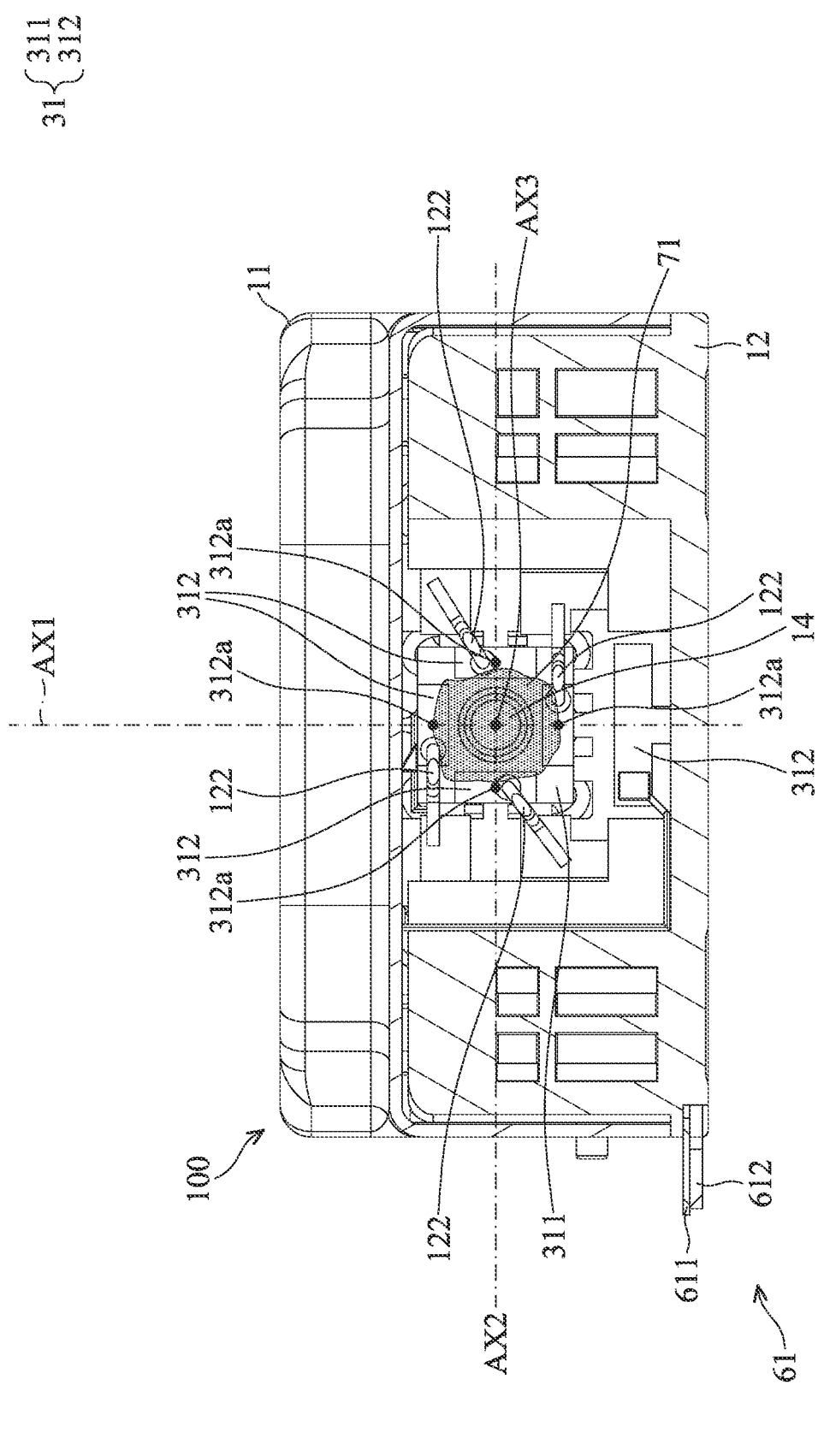
FIG. 7 is a cross-sectional view of the optical element driving mechanism and the optical element along line D-D' of FIG. 2, according to some embodiments of the present disclosure.

Please refer to FIG. 7, FIG. 7 is a cross-sectional view of the optical element driving mechanism 100 and the optical element OE along line D-D' of FIG. 2, according to some embodiments of the present disclosure.

As shown in FIG. 7, according to some embodiments of the present disclosure, the piezoelectric element 312 and the fixed part elastic body 14 may not overlap each other when viewed along the third axis AX3. According to some embodiments of the present disclosure, the fixed part elastic body 14 and the centers 312a of the respective piezoelectric elements 312 may not overlap each other when viewed along the third axis AX3. In this way, the deformation of the piezoelectric element 312 may be prevented from being affected by the fixed part elastic body 14.

According to some embodiments of the present disclosure, the respective piezoelectric elements 312 may be electrically connected to the circuit elements 61 of the circuit assembly 60 by respective metal wires 122. According to some embodiments of the present disclosure, the insulating glue 71 may be disposed between the piezoelectric elements 312 to avoid the electrical connection between the piezoelectric elements 312.

However, it should be noted that the piezoelectric elements 312 may share a ground wire. In this way, the number of elements required by the optical element driving mechanism 100 may be reduced, thereby achieving the effect of miniaturization.

According to some embodiments of the present disclosure, the respective voltages applied to the respective piezoelectric elements 312 may have different phases, so that the respective piezoelectric elements 312 and the piezoelectric-assembly metal-plate 311 of the piezoelectric assembly 31 generate a peristaltic movement, so as to move the supporting element 22.

That is to say, the above configuration makes the piezoelectric-assembly metal-plate 311 corresponding to the respective piezoelectric elements 312 (which may be attached or contacted) are located on the same or different planes, so that the supporting element 22 is in contact with different parts of the piezoelectric-assembly metal-plate 311, which in turn drives the supporting element 22 to move.

Figure 8:
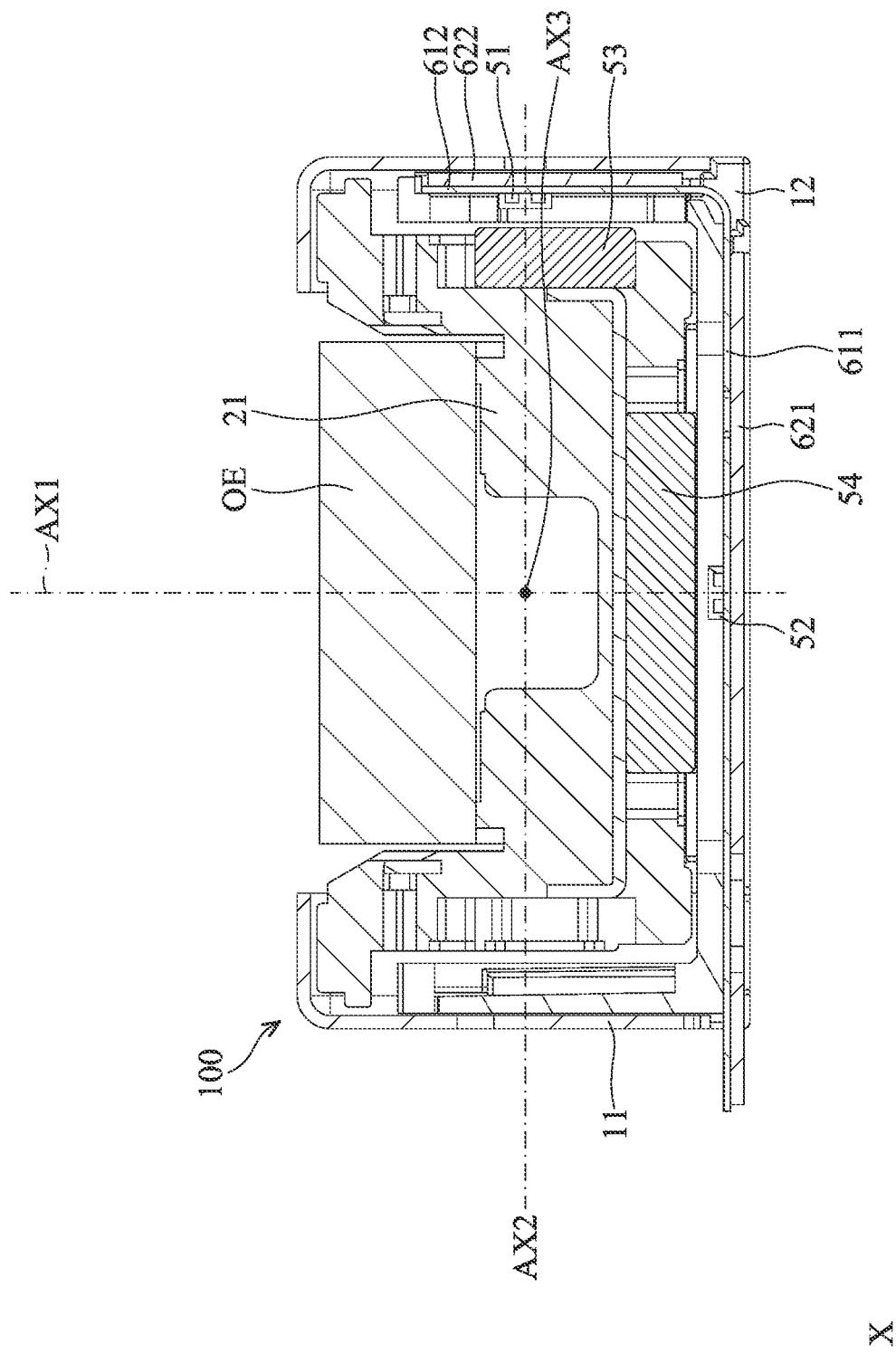
FIG. 8 is a cross-sectional view of the optical element driving mechanism and the optical element along line E-E' of FIG. 2, according to some embodiments of the present disclosure.

Please refer to FIG. 8, FIG. 8 is a cross-sectional view of the optical element driving mechanism 100 and the optical element OE along line E-E' of FIG. 2, according to some embodiments of the present disclosure.

As shown in FIG. 8, according to some embodiments of the present disclosure, the first sensing element 51 may be disposed on the circuit element second portion 612 of the circuit element 61, and the second sensing element 52 may be disposed on the circuit element first portion 611.

In this way, the structure of the circuit element 61 may be enhanced, thereby improving the stability of the optical element driving mechanism 100.

According to some embodiments of the present disclosure, the first sensing element 51 may be disposed between the circuit element second portion 612 and the first sensing magnetic element 53, and the second sensing element 52 may be disposed between the circuit element first portion 611 and the second sensing magnetic element 54.

Please continue to refer to FIG. 8, according to some embodiments of the present disclosure, the first reinforcement element 621 may be disposed on the circuit element first portion 611, and the second reinforcement element 622 may be disposed on the circuit element second portion 612.

According to some embodiments of the present disclosure, the circuit element first portion 611 may be disposed between the holder 21 and the first reinforcement element 621, and the circuit element second portion 612 may be disposed between the holder 21 and the second reinforcement element 622.

According to some embodiments of the present disclosure, the circuit element first portion 611 may be disposed between the second sensing magnetic element 54 and the first reinforcement element 621, and the circuit element second portion 612 may be disposed between the first sensing magnetic element 53 and the second reinforcement element 622.

In this way, the structure of the optical element driving mechanism 100 may be enhanced, and thereby improving the stability of the optical element driving mechanism 100.

According to some embodiments of the present disclosure, the circuit element 61 may directly receive an external current to drive the internal elements of the optical element driving mechanism 100. According to some embodiments of the present disclosure, after the circuit element 61 directly receives the external current, it may transmit the current to the metal wire 122 embedded in the base body 121.

Therefore, it should be noted that the base 12 and the circuit element 61 are different elements. Moreover, according to some embodiments of the present disclosure, the metal wires 122 of the base 12 do not directly receive external current.

Please refer to FIG. 9A, FIG. 9A is a schematic view of the configuration of a piezoelectric assembly 31 of the optical element driving mechanism 100 and the optical element OE according to some embodiments of the present disclosure.

As shown in FIG. 9A, according to some embodiments of the present disclosure, the piezoelectric assembly 31 and the optical element OE may be arranged along the third axis AX3.

The piezoelectric assembly 31 may at least partially overlap the optical element OE when viewed along the third axis AX3. According to some embodiments of the present disclosure, the piezoelectric assembly 31 and the optical element OE may not overlap each other when viewed along the first axis AX1. The piezoelectric assembly 31 and the optical element OE may not overlap each other when viewed along the second axis AX2.

In this way, the height of the optical element driving mechanism 100 in the first axis AX1 may be reduced, and the width of the optical element driving mechanism 100 in the second axis AX2 may be reduced.

Please refer to FIG. 9B, FIG. 9B is a schematic view of the configuration of the piezoelectric assembly 31 of the optical element driving mechanism 100 and the optical element OE according to some embodiments of the present disclosure.

As shown in FIG. 9B, according to some embodiments of the present disclosure, the piezoelectric assembly 31 and the optical element OE may be arranged along the first axis AX1.

According to some embodiments of the present disclosure, the piezoelectric assembly 31 may at least partially overlap the optical element OE when viewed along the first axis AX1. According to some embodiments of the present disclosure, the piezoelectric assembly 31 and the optical element OE may not overlap each other when viewed along the second axis AX2. According to some embodiments of the present disclosure, the piezoelectric assembly 31 and the optical element OE may not overlap each other when viewed along the third axis AX3.

In this way, the width of the optical element driving mechanism 100 in the second axis AX2 may be reduced, and the length of the optical element driving mechanism 100 in the third axis AX3 may be reduced.

Please refer to FIG. 9C, FIG. 9C is a schematic view of the configuration of the piezoelectric assembly 31 of the optical element driving mechanism 100 and the optical element OE according to some embodiments of the present disclosure.

As shown in FIG. 9C, according to some embodiments of the present disclosure, the piezoelectric assembly 31 and the optical element OE may be arranged along the second axis AX2.

According to some embodiments of the present disclosure, the piezoelectric assembly 31 may at least partially overlap the optical element OE when viewed along the second axis AX2. According to some embodiments of the present disclosure, the piezoelectric assembly 31 and the optical element OE may not overlap each other when viewed along the first axis AX1. According to some embodiments of the present disclosure, the piezoelectric assembly 31 and the optical element OE may not overlap each other when viewed along the third axis AX3.

In this way, the height of the optical element driving mechanism 100 in the first axis AX1 may be reduced, and the length of the optical element driving mechanism 100 in the third axis AX3 may be reduced.

Please refer to FIG. 10A, FIG. 10A is a schematic view of the configuration of the piezoelectric assembly 31 of the optical element driving mechanism 100 according to some embodiments of the present disclosure.

According to some embodiments of the present disclosure, the piezoelectric elements 312 of the piezoelectric assembly 31 may be arranged in four corners, and the piezoelectric elements 312 do not cover the piezoelectric-assembly metal-plate through-hole 311a.

According to some embodiments of the present disclosure, the piezoelectric element 312 may cover most of the piezoelectric-assembly metal-plate 311. In this way, when the piezoelectric assembly 31 receives the same current, it may have a larger displacement, thereby achieving higher motion efficiency.

Please refer to FIG. 10B, FIG. 10B is a schematic view of the configuration of the piezoelectric assembly 31 of the optical element driving mechanism 100 according to some embodiments of the present disclosure.

According to some embodiments of the present disclosure, the piezoelectric elements 312 of the piezoelectric assembly 31 may be arranged symmetrically on four sides, and the piezoelectric elements 312 do not cover the piezoelectric-assembly metal-plate through-hole 311a.

According to some embodiments of the present disclosure, the piezoelectric element 312 may only cover part of the edge portion of the piezoelectric-assembly metal-plate 311. In this way, when the piezoelectric assembly 31 receives the same current, it may have a fine displacement amount, thereby achieving the effect of precise control.

Please refer to FIG. 10C, FIG. 10C is a schematic view of the configuration of the piezoelectric assembly 31 of the optical element driving mechanism 100 according to some embodiments of the present disclosure.

According to some embodiments of the present disclosure, the piezoelectric elements 312 of the piezoelectric assembly 31 may be arranged in rotational symmetry, and the piezoelectric elements 312 do not cover the piezoelectric-assembly metal-plate through-hole 311a.

According to some embodiments of the present disclosure, the piezoelectric element 312 may only cover part of the edge portion of the piezoelectric-assembly metal-plate 311. In this way, the piezoelectric assembly 31 may be free of motion nodes, thereby increasing the stability of the optical element driving mechanism 100.

In general, the optical element driving mechanism of the embodiment of the present disclosure may have the effects of miniaturization, improved stability, increased motion efficiency, and increased motion accuracy, so that the user may smoothly operate the optical element driving mechanism.

Although embodiments of the present disclosure and their advantages have been described in detail, it should be understood that various changes, substitutions and alterations may be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, the scope of the present disclosure is defined by the scope of the appended claims. In addition, each scope of the claims is constructed as a separate embodiment, and various combinations of the claims and combinations of embodiments are within the scope of the present disclosure.

What is claimed is:
1. An optical element driving mechanism, comprising:
a fixed part;
a movable part, comprising:
a holder, holding an optical element; and
a supporting element, connected to the holder; and
a driving assembly, driving the movable part to move relative to the fixed part;
wherein the holder uses the supporting element as a fulcrum and moves relative to the fixed part around a first axis and a second axis, wherein the first axis is not parallel to the second axis,
wherein the driving assembly comprises a piezoelectric assembly, and the piezoelectric assembly comprises:
    a piezoelectric-assembly metal-plate, having a piezoelectric-assembly metal-plate through-hole; and
    a plurality of piezoelectric elements, disposed on the piezoelectric-assembly metal-plate,
    wherein the piezoelectric elements are rotationally symmetric with the piezoelectric-assembly metal-plate through-hole as the rotational symmetry center, and
    wherein the piezoelectric-assembly metal-plate through-hole has a chamfered structure, and the supporting element is in contact with the chamfered structure of the piezoelectric-assembly metal-plate through-hole.

2. The optical element driving mechanism as claimed in claim 1, further comprising an elastic assembly, the elastic assembly comprising:
    an elastic-assembly movable-part connecting-portion, connected to the movable part; and
    an elastic-assembly fixed-part connecting-portion, connected to the fixed part;
    wherein the elastic-assembly movable-part connecting-portion and the elastic-assembly fixed-part connecting-portion do not overlap each other when viewed along the first axis.

3. The optical element driving mechanism as claimed in claim 2, wherein the movable part further comprises a movable part magnet, and the fixed part further comprises a fixed part magnetic conductive element,
    wherein the movable part magnet is disposed on the holder, and the movable part magnet corresponds to the fixed part magnetic conductive element,
    wherein the elastic assembly is disposed between the movable part magnet and the fixed part magnetic conductive element, and
    wherein the magnetic conductivity of the elastic assembly is lower than the magnetic conductivity of the fixed part magnetic conductive element.

4. The optical element driving mechanism as claimed in claim 3, wherein there are two movable part magnets, and the supporting element is disposed between the movable part magnets.

5. The optical element driving mechanism as claimed in claim 1, further comprising a sensing assembly, the sensing assembly comprising:
    a first sensing element, sensing the movement of the movable part relative to the fixed part around the first axis; and
    a second sensing element, sensing the movement of the movable part relative to the fixed part around the second axis,
    wherein the movable part at least partially overlaps the second sensing element when viewed along the first axis,
    wherein the movable part and the second sensing element do not overlap each other when viewed along the second axis, and
    wherein the movable part and the first sensing element do not overlap each other when viewed along a third axis that is not parallel to the first axis or the second axis.

6. The optical element driving mechanism as claimed in claim 1, wherein a plurality of voltages that are applied to the piezoelectric elements have different phases, so that the piezoelectric elements and the piezoelectric-assembly metal-plate produce peristaltic movement to move the supporting element.

7. The optical element driving mechanism as claimed in claim 1, further comprising a connecting assembly, wherein the connecting assembly comprises an insulating glue, and
    wherein the insulating glue is disposed between the piezoelectric elements, and the piezoelectric elements share a ground wire.

8. The optical element driving mechanism as claimed in claim 1, wherein the piezoelectric assembly at least partially overlaps the optical element when viewed along the first axis,
    wherein the piezoelectric assembly and the optical element do not overlap each other when viewed along the second axis, and
    wherein the piezoelectric assembly and the optical element do not overlap each other when viewed along a third axis that is not parallel to the first axis or the second axis.

9. The optical element driving mechanism as claimed in claim 1, wherein the piezoelectric assembly at least partially overlaps the optical element when viewed along the second axis,
    wherein the piezoelectric assembly and the optical element do not overlap each other when viewed along the first axis, and
    wherein the piezoelectric assembly and the optical element do not overlap each other when viewed along the third axis that is not parallel to the first axis or the second axis.

10. The optical element driving mechanism as claimed in claim 1, wherein the piezoelectric assembly at least partially overlaps the optical element when viewed along the third axis that is not parallel to the first axis or the second axis,
    wherein the piezoelectric assembly and the optical element do not overlap each other when viewed along the first axis, and
    wherein the piezoelectric assembly and the optical element do not overlap each other when viewed along the second axis.

11. The optical element driving mechanism as claimed in claim 1, wherein the fixed part further comprises:
    a fixed part magnetic conductive element; and
    a fixed part elastic body, disposed on the fixed part magnetic conductive element, and the fixed part elastic body corresponds to the supporting element and the chamfered structure of the piezoelectric-assembly metal-plate through-hole,
    wherein when viewed along the third axis that is not parallel to the first axis or the second axis, the fixed part elastic body at least partially overlaps the supporting element and the chamfered structure of the piezoelectric-assembly metal-plate through-hole,
    wherein the fixed part elastic body and the centers of the piezoelectric elements do not overlap each other when viewed along the third axis,
    wherein the fixed part elastic body has higher flexibility than the fixed part magnetic conductive element, and
    wherein the fixed part elastic body comprises plastic or rubber.

12. The optical element driving mechanism as claimed in claim 1, wherein the fixed part further comprises a base, and the base comprises:
    a base body;
    a first-base protruding-portion, extending from the base body toward the piezoelectric assembly along the first axis, and the first-base protruding-portion is in contact with the piezoelectric assembly;

a second-base protruding-portion, extending from the base body toward the piezoelectric assembly along the second axis, and the second-base protruding-portion is in contact with the piezoelectric assembly; and a third-base protruding-portion, extending from the base body toward the piezoelectric assembly along the second axis, and the third-base protruding-portion is in contact with the piezoelectric assembly, wherein the extending direction of the third-base protruding-portion is opposite to the extending direction of the second-base protruding-portion.

13. The optical element driving mechanism as claimed in claim 12, wherein the second-base protruding-portion comprises:

a second-base protruding-portion first-protrusion;

a second-base protruding-portion second-protrusion; and a second-base protruding-portion third-protrusion, wherein the second-base protruding-portion first-protrusion is disposed between the second-base protruding-portion second-protrusion and the second-base protruding-portion third-protrusion, wherein in the second axis, the length of the second-base protruding-portion first-protrusion is greater than the length of the second-base protruding-portion second-protrusion and the length of the second-base protruding-portion third-protrusion, and wherein the second-base protruding-portion first-protrusion at least partially overlaps the piezoelectric-assembly metal-plate through-hole when viewed along the second axis.

14. The optical element driving mechanism as claimed in claim 12, wherein the first-base protruding-portion comprises:

a first-base protruding-portion first-protrusion;

a first-base protruding-portion second-protrusion; and a first-base protruding-portion third-protrusion;

wherein the first-base protruding-portion first-protrusion is disposed between the first-base protruding-portion second-protrusion and the first-base protruding-portion third-protrusion, and wherein in the first axis, the length of the first-base protruding-portion first-protrusion is greater than the length of the first-base protruding-portion second-protrusion and the length of the first-base protruding-portion third-protrusion.

15. The optical element driving mechanism as claimed in claim 14, further comprising a connecting assembly, wherein the connecting assembly comprises a soft glue, wherein the soft glue is disposed between the first-base protruding-portion first-protrusion and the piezoelectric assembly, wherein the soft glue is not disposed between the first-base protruding-portion second-protrusion and the piezoelectric assembly, and wherein the soft glue is not disposed between the first-base protruding-portion third-protrusion and the piezoelectric assembly.

16. The optical element driving mechanism as claimed in claim 12, wherein the first-base protruding-portion, the second-base protruding-portion, and the third-base protruding-portion do not overlap each other when viewed along the first axis, wherein the first-base protruding-portion and the second-base protruding-portion do not overlap each other when viewed along the second axis, wherein the first-base protruding-portion and the third-base protruding-portion do not overlap each other when viewed along the second axis, and wherein the second-base protruding-portion at least partially overlaps the third-base protruding-portion when viewed along the second axis.

17. The optical element driving mechanism as claimed in claim 1, further comprising a circuit assembly, wherein the fixed part comprises a base, and the base comprises a base body and a metal wire, wherein the metal wire is embedded in the base body, and the piezoelectric assembly is electrically connected to the circuit assembly via the metal wire, and wherein the circuit assembly directly receives an external current.

18. The optical element driving mechanism as claimed in claim 17, further comprising a sensing element, wherein the sensing element comprises a first sensing element and a second sensing element, wherein the circuit assembly comprises a circuit element, and the circuit element comprises a circuit element first portion, and a circuit element second portion, wherein the circuit element first portion is perpendicular to the first axis, and the circuit element first portion extends along the second axis, wherein the circuit element second portion is perpendicular to the second axis, and the circuit element second portion extends along the first axis, and wherein the first sensing element is disposed on the circuit element second portion, and the second sensing element is disposed on the circuit element first portion.

19. The optical element driving mechanism as claimed in claim 18, wherein the circuit element further comprises a reinforcement assembly, and the reinforcement assembly includes:

a first reinforcement element, disposed on the circuit element first portion; and a second reinforcement element, disposed on the circuit element second portion, wherein the circuit element first portion is disposed between the holder and the first reinforcement element, and wherein the circuit element second portion is disposed between the holder and the second reinforcement element.

\* \* \* \* \*